(12) United States Patent
Odake et al.

(10) Patent No.: US 6,424,092 B1
(45) Date of Patent: Jul. 23, 2002

(54) FLAT DISPLAY DEVICE AND WIRING METHOD THEREOF, AND IMAGE DISPLAY SYSTEM

(75) Inventors: Ryota Odake, Tokyo; Nobutoshi Asai, Kanagawa; Yoshinari Matsuda, Kanagawa; Yoshio Suzuki, Kanagawa, all of (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/492,617

(22) Filed: Jan. 27, 2000

(30) Foreign Application Priority Data

Jan. 29, 1999 (JP) .......................................... 11-022519

(51) Int. Cl.⁷ ................................................ G09G 3/10
(52) U.S. Cl. ...................... 315/169.3; 345/80; 349/149; 445/25
(58) Field of Search ............................ 315/169.3, 169.2, 315/169.4; 345/52, 76, 80; 349/143, 149, 150; 445/24, 25, 29

(56) References Cited

U.S. PATENT DOCUMENTS

| 4,816,716 A | * | 3/1989 | Kobayakawa et al. ...... 313/496 |
| 4,963,002 A | * | 10/1990 | Tagusa et al. ............... 350/336 |
| 4,988,995 A | * | 1/1991 | Buisson et al. ............. 340/971 |
| 5,029,984 A | * | 7/1991 | Adachi et al. ............... 350/334 |
| 5,686,977 A | * | 11/1997 | Kim et al. ................... 349/143 |
| 5,831,387 A | * | 11/1998 | Kaneko et al. ............. 313/495 |
| 6,005,649 A | * | 12/1999 | Krusius et al. ................ 349/73 |

* cited by examiner

*Primary Examiner*—Don Wong
*Assistant Examiner*—Thuy Vinh Tran
(74) *Attorney, Agent, or Firm*—Frommer Lawrence & Haug LLP; William S. Frommer; Samuel H. Megerditchian

(57) ABSTRACT

The present invention provides an organic thin film EL which can reduce a non-display area when using a plurality of display panels as a single screen, and can prevent a generation of migration. In a flat display device (50) laminating a display material and electrodes (52) and (57), a driver circuit connected to these electrodes (52) and (57) is arranged inside a sealing member (30) covering a back surface of the flat display device (50), and wirings (31) and (70) for connecting a power supply circuit and a signal supply circuit to the driver circuit are led from the inside of the sealing member (30) to the back side of the flat display device (50).

17 Claims, 15 Drawing Sheets

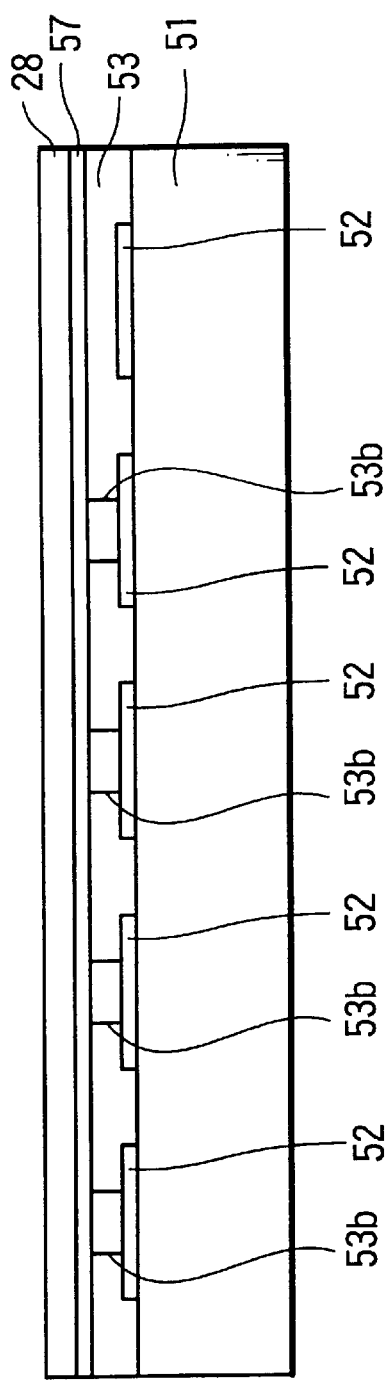
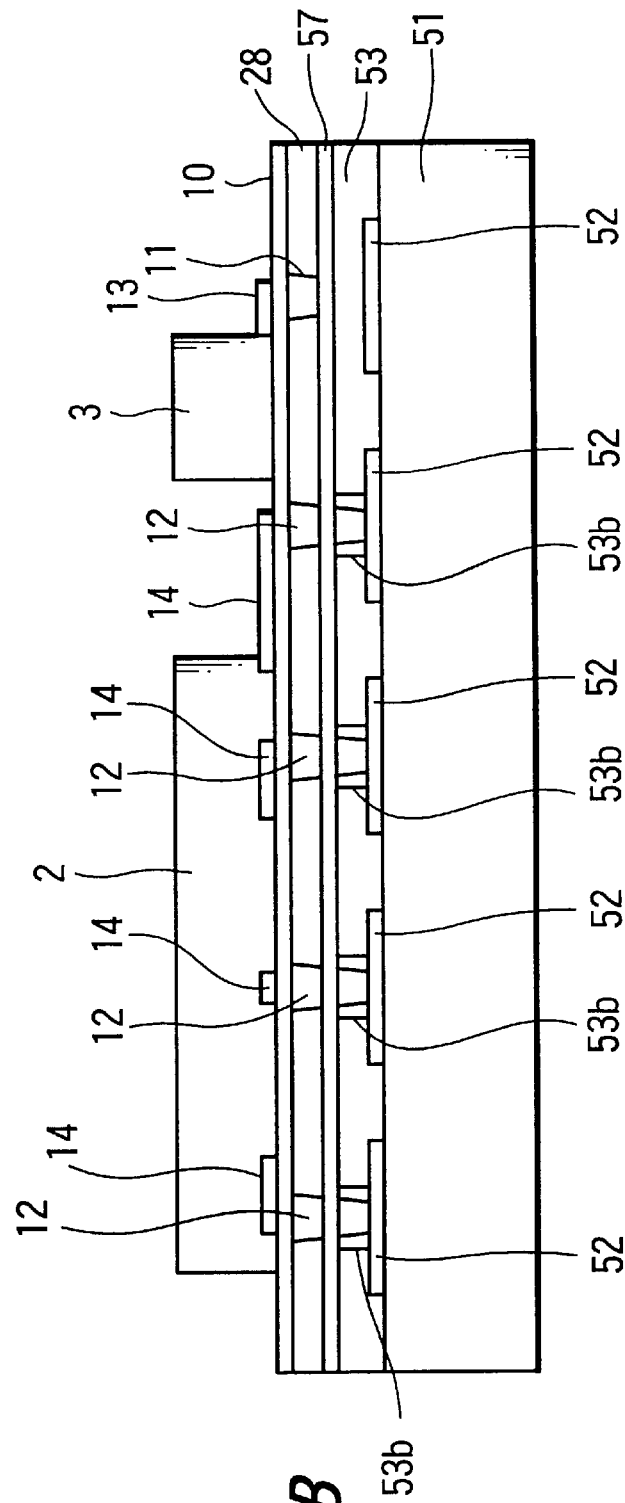
FIG. 9A
FIG. 9B

FLAT DISPLAY DEVICE AND WIRING METHOD THEREOF, AND IMAGE DISPLAY SYSTEM

BACKGROUND OF THE INVENTION

1. Field of the Invention

The present invention relates to a flat display device which is characterized in a wiring (pattern) for connecting an electrode and a driver circuit, and a wiring method for connecting the electrode and the driver circuit of the flat display device. Further, the present invention relates to an image display system which is constructed in a manner that a plurality of display panels comprising a flat display device are arranged in an adjacent state.

2. Description of the Related Art

As one kind of a flat display panel type display, there is an electro-luminescent display (hereinafter, referred simply to as "ELD"). The ELD has been made based on the principle of an electro-luminescence which is a light emission phenomenon taken place when a voltage is applied to a fluorescent substance (material). Further, the ELD has the following various merits (1) to (3):

(1) since the ELD is a self light emission type display, it has a high luminance (thus, high contrast), a wide viewing angle, and a high response speed;

(2) since the whole of display device consists of a solid, the display device is strong in vibration; and (3) it is possible to readily make the ELD thin.

In the light of a chemical composition of display material (fluorescent material), the display device of the ELD is classified into an inorganic EL using an inorganic compound and an organic EL using an organic compound. Further, in the light of a physical shape of the display material, the display device of the ELD is classified into a dispersed type EL using a powdered display material, and a thin film EL using a dense thin film display material. In recent years, among these ELs, in particular, an organic thin film EL has attracted special interest from the following reasons. More specifically, a high luminance is obtain at a low voltage, and a fluorescent color itself of the organic compound is a light emission color; therefore, selection of the light emission color is easy.

FIG. 13 shows one example of a structure of the organic thin film EL. In this organic thin film EL 50, an anode electrode 52 is formed like a stripe on a glass substrate 51, and has a film thickness of about several hundreds of angstrom to several μm. The anode electrode 52 is, for example, a transparent electrode consisting of ITO (indium-tin oxide), and is also called as a column electrode because an direction of the stripe is a longitudinal direction of a display screen.

The column electrode 52 is formed with an organic layer 53 having a film thickness of about several hundreds of angstrom to several μm, at its upper portion and surrounding. The organic layer 53 has a three-layer structure in which an organic positive hole transport layer 54, an organic light emission layer 55 and an organic electron transport layer 56 are laminated in order when viewing from the column electrode 52 side.

The organic positive hole transport layer 54 consists of a mixture of Alq3 (tris-(8-hydroxyquinoline) aluminum) and DCM (4-dicyanomethylene-6-(p-dimethyleaminostyril)-2-methyle-4H-pyrane, for example. Further, the organic positive hole transport layer 54 has a function of moving a positive hole injected from the column electrode 52 to the organic light emission layer 55. The organic electron transport layer 56 consists of a triphenyldiamine derivative (TPD) (N,N'-bis (3-methyl phenyl) 1,1'-biphenyl-4,4'-diamine). Further, the organic electron transport layer 55 has a function of moving an electron injected from a row electrode 57 which will be described later to the organic light emission layer 55.

The organic light emission layer 55 consists of a fluorescent material corresponding to a color to be displayed; for example, DCM is used as a red fluorescent material, Alq3 is used as a green fluorescent material, and a zinc complex of Zn(oxz) 2 (2-(o-hydroxyphenyl)-benzoxazole is used as a blue fluorescent material. In the case of displaying a white color, the following methods are employed; more specifically, there are the methods of dispersing red, green and blue fluorescent materials in a high molecule so as to be synthesized and laminating these fluorescent materials so as to be synthesized.

A cathode electrode 57 is formed like a stripe so as to be perpendicular to the column electrode 52 on the organic electron transport layer 56. The cathode electrode 57 consists of a metal such as aluminum and an alloy of aluminum and lithium, for example, and is also called as a row electrode because the direction of the stripe is a lateral direction of the display screen.

When a voltage is applied between the column electrode 52 and the row electrode 57, a positive hole injected from the column electrode 52 is moved to the organic light emission layer 55 via the organic positive hole transport layer 54 while an electron injected from the row electrode 57 being moved to the organic light emission layer 55 via the organic electron transport layer 56. The positive hole and the electron are mutually recombined at the intersecting point of the column electrode 52 and the row electrode 57 in the organic light emission layer 55. The fluorescent material constituting the organic light emission layer 55 regards the recombination as an external stimulus, and then, is excited. When returning from the excitation state to a ground state, the fluorescent material radiates a fluorescence; therefore, a light is observed from the glass substrate 51 side.

Thus, the column electrode 52 and the row electrode 57 are used as a signal electrode and a scanning electrode, respectively, and then, a display signal and a scanning signal are supplied to a display panel using the organic thin film EL as a display device, and thereby, it is possible to display a desired image using each intersecting point of the column electrode 52 and the row electrode 57 as a pixel.

FIG. 14 is a circuit diagram showing a construction of a display unit for displaying an image on a display panel 100 using the organic thin film EL as a display device. An analog video signal (display signal) supplied from a video signal reproduction system (not shown) is converted into a digital signal by means of an A/D converter 101, and thereafter, is supplied to a column driver (driving circuit for display signal supply) 102. The column driver 102 stores the display signal thus supplied by one line of a screen, and then, supplies the display signal thus stored to all column electrodes (not shown) of the display panel 100 in parallel.

On the other hand, a row driver (driving circuit for scanning signal supply) 103 successively scans the row electrode (not shown) of the display panel 100 one by one at intervals of one field (or one frame). Each operation of the A/D converter 101, the column driver 102 and the row driver 103 is controlled by means of a controller (e.g., CPU) 104, and a power supply voltage is supplied from a power supply block 105 to these A/D converter 101, column driver 102, row driver 103 and controller 104.

Conventionally, in the display unit, in order to connect the column electrode and the row electrode to a driver circuit (the column driver 102 and the row driver 103 shown in FIG. 14, respectively), a wiring has been given so that these electrodes and the driver circuit are connected at an edge portion of each electrode (i.e., near by the organic thin film EL) in an outer side of a sealing cap for covering and protecting a back side (i.e., side opposite to the glass substrate) of the organic thin film EL. As a result, in the conventional organic thin film EL, the wiring for connecting the column electrode and the row electrode with the driver circuit has been arranged like a picture frame, that is, around the edge of the organic thin film EL.

FIG. 15 shows one example of a state that the aforesaid wiring is given to the organic thin film EL so as to be connected with the driver circuit. The back side of the organic thin film EL 50 shown in FIG. 13 is covered with a sealing cap 110 (the downward portion of FIG. 15 is shown as a cross section) in an outer side of the cap 110. The edge portion of the column electrode 52 and a column driver substrate 112 mounted with a column driver IC 111 are connected by a flexible printed cable (FPC) substrate 113. Likewise, the edge portion of the row electrode 57 and a row driver substrate 115 mounted with a row driver IC (driver circuit for scanning signal supply) 114 are connected by an FPC substrate 116. As a result, The FPC substrates 113 and 116 are arranged around the edge portion of the organic thin film EL 50.

Moreover, in the example shown in FIG. 15, in addition to these EPC substrates 113 and 116, the column driver substrate 112 and the row driver substrate 115 are also arranged around the edge portion of the organic thin film EL 50 like a picture frame. In this case, these FPC substrates 113 and 116 are bent upwardly, and thereby, it is possible to make an arrangement such that the column driver substrate 112 and the row driver substrate 115 are not arranged around the edge portion of the organic thin film EL 50. However, even if the aforesaid arrangement is made, after all, the FPC substrates 113 and 116, or at least their part is arranged around the edge portion of the organic thin film EL 50.

By the way, in recent years, the flat display panel type display has a tendency to have a large-size screen. However, the following problems arise. More specifically, in general, when a display panel becomes a large size, a resistance of electrode increases; for this reason, a driving voltage must be made high. Moreover, in particular, in the case of the organic thin film EL, a current proportion to a pixel size must be supplied to each pixel; for this reason, a power consumption increase accompanying with the large-size screen.

So, in the case of the organic thin film EL, in place of making large individual display panel and pixel, as shown in FIG. 16, a plurality of display panels 100 are arranged like a tile, and then, these display panels 100 are used as a single screen. This is an effective method for making large a screen while restricting an increase of power consumption.

In the conventional organic thin film EL, as described above, the wiring for connecting the column electrode and the row electrode with the driver circuit is arranged around the edge portion of the organic thin film EL. For this reason, in the case where a plurality of display panels are arranged like a tile, as also shown in FIG. 16, a wiring 120 (equivalent to the FPC113 and 116 in the example of FIG. 15) becomes a state of being interposed between adjacent display panels 100. As a result, in the case where these display panels are used as a single screen so as to display an image, a non-display area by the wiring exists for each space between adjacent display panels, and becomes conspicuous; for this reason, the display panel as described above is not adaptable to a practical use.

Moreover, in general, as a factor of lowering a reliability of integrated circuit, there is the following phenomenon. More specifically, a wiring of the integrated circuit increases a resistance and makes a breakdown by a migration (i.e., phenomenon such that when a density of a current flowing through a wiring metal becomes high, a metal ion is moved by a momentum exchange of an electron and a metal ion). It has been known that the higher a surrounding humidity is, the easier this migration takes place.

Thus, in the conventional organic thin film EL, as described above, the wiring for connecting the column electrode and the row electrode with the driver circuit is performed at the outside of the sealing cap; for this reason, the wiring is in a state of contacting with an external air. As a result, in the case where a display is used at a place having a high humidity, the migration by the wiring is easy to take place; for this reason, this causes a problem of lowering a reliability of the display.

SUMMARY OF THE INVENTION

It is, therefore, an object of the present invention to provide an organic thin film EL which has a wiring capable of reducing a non-display area in the case of using a plurality of display panels as a single screen, and preventing a generation of migration. Further, another object of the present invention is to provide a method of forming this wiring to the organic thin film EL. Furthermore, another object of the present invention is to provide an image display system using the aforesaid display panel.

To achieve the above objects, the present invention provides a flat display device laminating a display material and an electrode, wherein a wiring for connecting the driver circuit to the electrode is led from an inside of a sealing member covering a back side of the flat display device to the back side of the flat display device.

Further, the present invention provides a flat display device laminating a display material and an electrode, wherein a driver circuit connected to the electrode is arranged inside the sealing member covering a back side of the flat display device, and a wiring for connecting a power supply circuit and a signal supply circuit to the driver circuit is led from the inside of the sealing member to the back side of the flat display device.

Further, the present invention provides a wiring method for connecting an electrode to a driver circuit in a flat display device laminating a display material and an electrode, comprising the following steps of: forming an insulative protection layer on a back side of the flat display device; mounting a connector for connecting a driver circuit to the electrode on the protection layer, and forming an wiring for connecting the connector to the electrode on the protection layer; covering the back side of the flat display device with a sealing member having an opening at its part thereof so that the connector is passed through the opening; and sealing a contact portion of the connector with the sealing member.

Further, the present invention provides a wiring method for connecting an electrode to a driver circuit in a flat display device laminating a display material and an electrode, comprising the following steps of: forming a thermoplastic bonding layer on a back side of the flat display device; mounting a connector for connecting a driver circuit to the electrode on a flexible printed board, and forming a wiring for connecting the connector to the electrode on a flexible printed board; forming a bump on a portion corresponding to the wiring in the flexible printed board; heating the bonding layer, and bonding the flexible printed board onto the back side of the flat display device with pressure in a state of contacting the bump with the electrode; covering the back side of the flat display device with a sealing member having an opening at its part thereof so that the connector is passed through the opening; and sealing a contact portion of the connector with the sealing member.

Further, the present invention provides a wiring method for connecting an electrode to a driver circuit in a flat display device laminating a display material and an electrode, comprising the following steps of: forming an insulative protection layer on a back side of the flat display device; mounting a driver circuit and a connector for connecting a signal line and power supply line to the driver circuit on the protection layer, and forming a wiring for connecting the connector to the electrode and a wiring for connecting the connector to the driver circuit on the protection layer; covering the back side of the flat display device with a sealing member having an opening at its part thereof so that the connector is passed through the opening; and sealing a contact portion of the connector with the sealing member.

Further, the present invention provides a wiring method for connecting an electrode to a driver circuit in a flat display device laminating a display material and an electrode, comprising the following steps of: forming a thermoplastic bonding layer on a back side of the flat display device; mounting a driver circuit and a connector for connecting a signal line and power supply line to the driver circuit on a flexible printed board, and forming a wiring for connecting the driver circuit to the electrode and a wiring for connecting the connector to the driver circuit on the flexible printed board; forming a bump on a portion corresponding to the wiring for connecting the driver circuit to the electrode in the flexible printed board; heating the bonding layer, and bonding the flexible printed board onto the back side of the flat display device with pressure in a state of contacting the bump with the electrode; covering the back side of the flat display device with a sealing member having an opening at its part thereof so that the connector is passed through the opening; and sealing a contact portion of the connector with the sealing member.

Further, the present invention provides an image display system having a plurality of display panels which are arranged in an adjacent state so as to constitute a single screen, wherein the display panel comprises a flat display device laminating a display material and an electrode, and a wiring for connecting a driver circuit to the electrode is led from an inside of a sealing member covering a back side of the flat display device to the back side of the flat display device.

Further, the present invention provides an image display system having a plurality of display panels which are arranged in an adjacent state so as to constitute a single screen, wherein the display panel comprises a flat display device laminating a display material and an electrode, and a driver circuit connected to the electrode is arranged inside a sealing member covering a back side of the flat display device, and further, a wiring for connecting a power supply circuit and a signal supply circuit to the driver circuit to the electrode is led from an inside of a sealing member to the back side of the flat display device.

BRIEF DESCRIPTION OF THE DRAWINGS

These and other objects and features of the present invention will become clear from the following description of the preferred embodiments given with reference to the accompanying drawings, in which:

FIG. 9 is a view to explain a method of connecting a wiring of the FPC substrate forming the bump with the row electrode and the column electrode;

DETAILED DESCRIPTION OF THE PREFERRED EMBODIMENT

Figure 13:
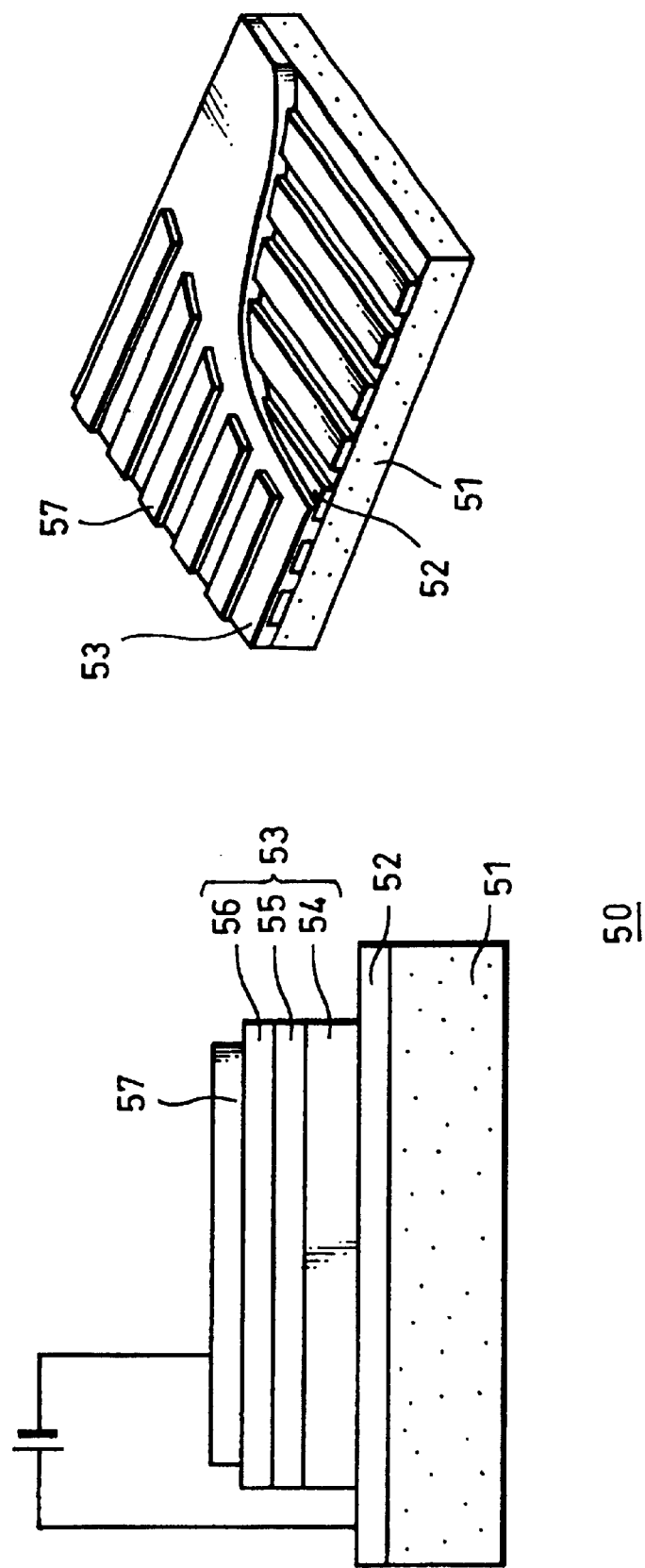
FIG. 13 is a view showing a basic structure of an organic thin film EL.

The following is a description on an organic thin film EL to which the present invention is applied. In this case, the organic thin film EL has the same structure as that shown in FIG. 13 except an opening formed in an organic layer which will be described later; therefore, like reference numerals are used to designate the same components as shown in FIG. 13.

[Embodiment 1]

Figure 1:
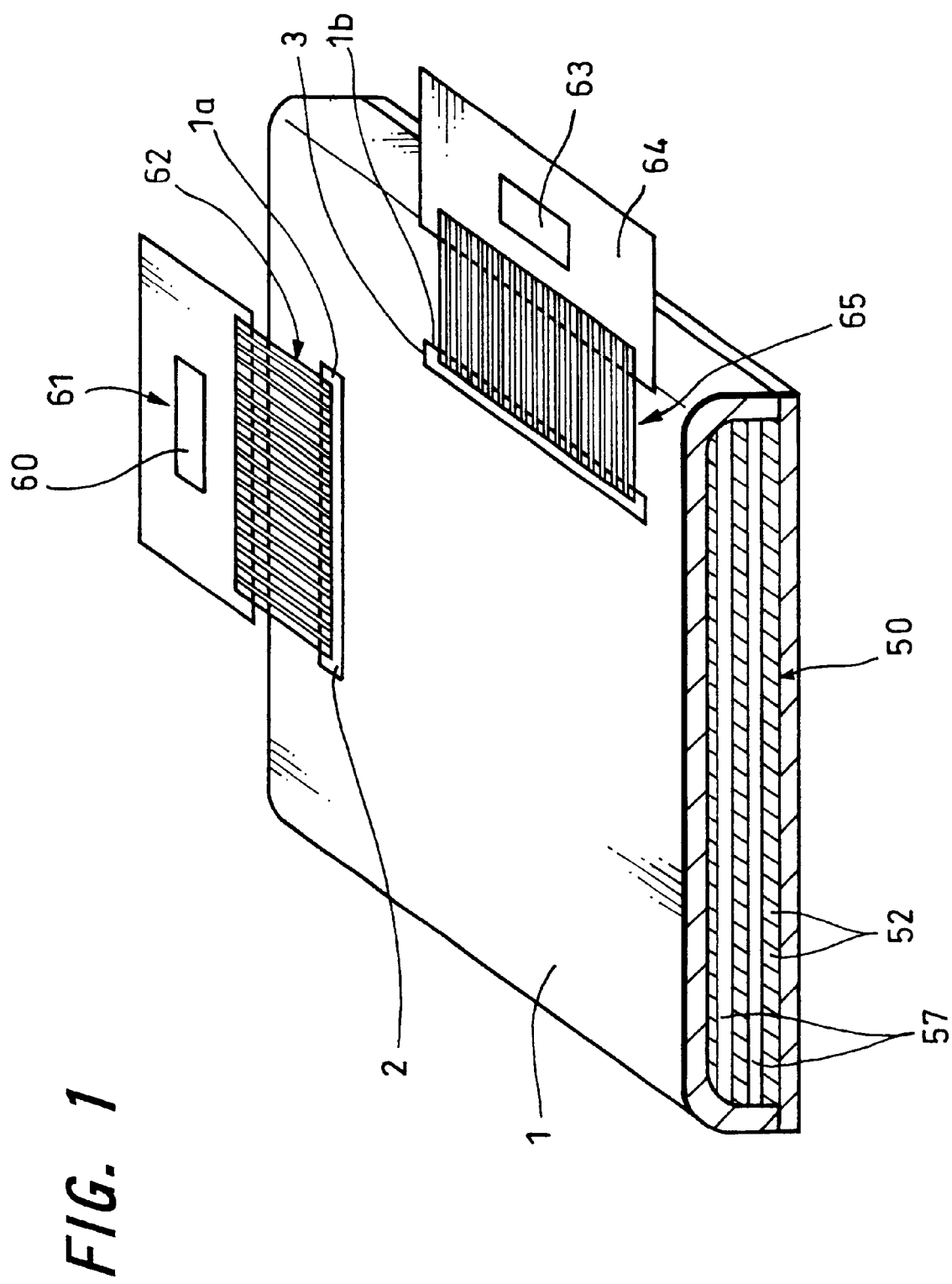
FIG. 1 is a perspective view showing an appearance structure of an organic thin film EL to which the present invention is applied.

First, the following is a description on a first embodiment of the organic thin film EL to which the present invention is applied. FIG. 1 is a view showing an appearance structure of the organic thin film EL. A back side (surface on an upper portion in FIG. 1) of the organic thin film 50 is covered with a sealing cap 1 (a lower portion of FIG. 1 is shown as a cross section). The sealing cap 1 comprises an aluminum or iron plate, or a member such as a glass sheet having an excellent sealing property.

In the back side of the organic thin film EL 50, connectors 2 and 3 are respectively exposed through openings 1*a* and 1*b* which are formed in the cap 1 and have the substantially same size as the connectors 2 and 3. The connector 2 is used for connecting a driver circuit to a column electrode 52; on the other hand, the connector 3 is used for connecting a driver circuit to a row electrode 53. The connector 2 is connected with a column driver substrate 61 mounted with a column driver IC 60 by a flexible printed cable (FPC) substrate 62. Moreover, the connector 3 is connected with a row driver substrate 64 mounted with a row driver IC 63 by an FPC substrate 65. In an inside of the cap 1, a drying accelerator and an oxidation inhibitor (both not shown) are applied to an inner surface of the cap 1.

Figure 2:
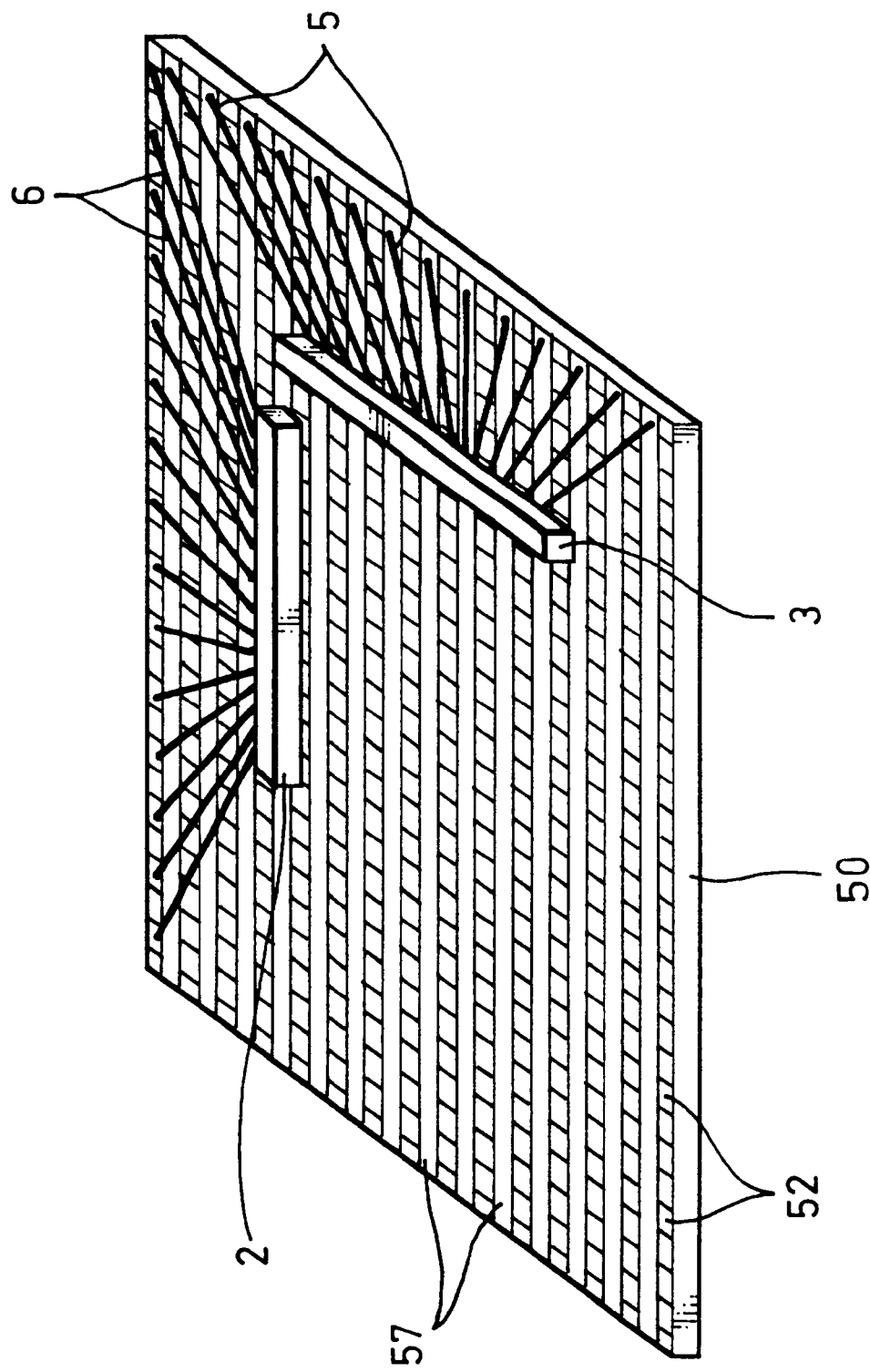
FIG. 2 is a perspective view showing a wiring inside of a cap in the organic thin film EL of FIG. 1.
Figure 3:
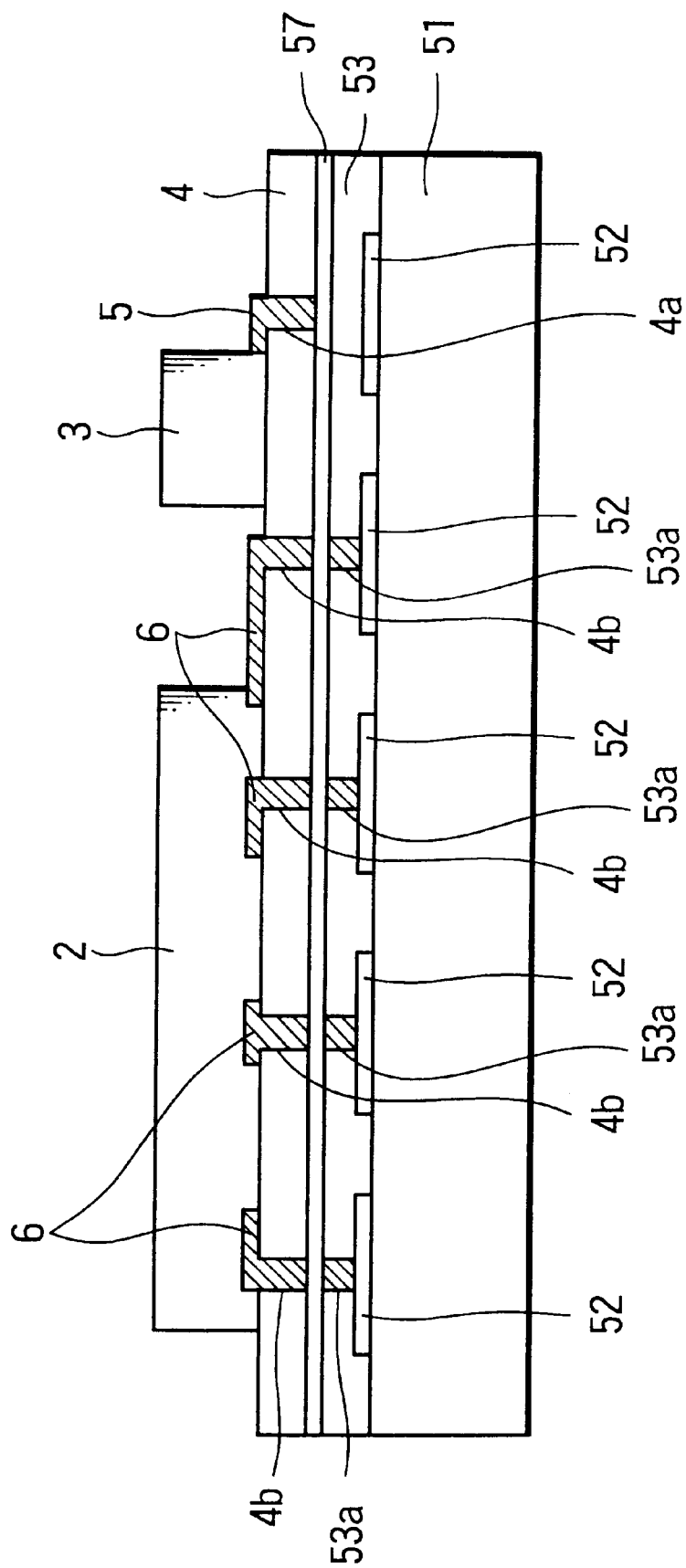
FIG. 3 is a cross sectional view showing a state of connecting a column electrode and a row electrode with a connector by the wiring of FIG. 2.

FIG. 2 is a view showing a wiring inside of the cap 1 in the organic thin film EL 50 of FIG. 1, and FIG. 3 is a cross sectional view showing a state of connecting the column electrode 52 and the row electrode 57 with connectors 2 and 3 by the wiring of FIG. 2. As shown in FIG. 3, a protection layer 4 made of an insulating material is formed on the back side of the organic thin film EL 50 (i.e., on the row electrode 57). The protection layer 4 is formed with a through hole 4a at a position just above each row electrode 57 in the inside of the cap 1.

As shown in FIG. 2 and FIG. 3, the connector 3 and the bottom portion of the through hole 4a on each row electrode 57 are connected by a surface of the protection layer 4 and a wiring 5 formed in the through hole 4a (In FIG. 2, no protection layer is shown). Accordingly, a scanning signal from the row driver IC 63 is supplied to each row electrode 57 using the bottom portion of the through hole 4a as a feeding point.

As shown in FIG. 3, the protection layer 4 is further formed with a through hole 4b at a position just above each column electrode 52 and avoiding the overhead position of the row electrode 57. An organic layer 53 of the organic thin film EL 50 is formed with a through hole 53a which extends to the column electrode 52, at a position just below each through hole 4b.

Moreover, as shown in FIG. 2 and FIG. 3, the connector 2 and the bottom portion of the through hole 53a on each column electrode 52 are connected by a surface of the protection layer 4 and a wiring 6 formed in the through holes 4a and 53a. Accordingly, a scanning signal from the row driver IC 60 is supplied to each column electrode 52 using the bottom portion of the through hole 4b as a feeding point.

Next, the following is a description on a method of giving the wiring as shown in FIG. 2 and FIG. 3 to the organic thin film EL 50. First, the protection layer 4 forming through holes 4a and 4b is previously formed on the row electrode 57 as a mask pattern by printing (photomechanical process), vacuum evaporation, CVD (chemical vapor deposition process) or the like. (In this case, to set forth as a premise, in a process for manufacturing the organic thin film EL 50, the organic layer 53 forming the through hole 53a is previously formed.) Or, to give another example, the protection layer 4 forming no through hole is formed, and thereafter, by irradiating an excimer laser, the protection layer 4 may be formed with through holes 4a and 4b, and simultaneously, the organic layer 53 may be formed with the through hole 53a.

The position forming the through hole 4a may be an arbitrary position just above each row electrode 57 in a range of an inside of the cap 1 when the back side of the organic thin film EL 50 is covered with the cap 1. However, in order not to give a damage to a pixel in a process of forming a wiring , preferably, the through hole 4a is formed at a position avoiding the overhead position of the intersecting point of the row electrode 57 and the column electrode 52. On the other hand, the position forming the through hole 4b may be an arbitrary position just above each column electrode 52 and avoiding the overhead position of the row electrode 57 in a range of an inside of the cap 1 when the back side of the organic thin film EL 50 is covered with the cap 1.

Subsequently, the connectors 2 and 3 are fixed and mounted on the protection layer 4 by soldering, an electro-conductive adhesive and the like, and then, wiring 5 and 6 are formed on the protection layer 4 by printing. This process may be the same as the process of mounting electronic components and forming a wiring on a printed board. However, the organic thin film EL deteriorates in its performance when a temperature becomes more than 100° C. For this reason, the formation of the wiring and 6 should be carried out in a low temperature process less than 100° C. using a silver epoxy material and the like.

In the aforesaid manner, the wiring as shown in FIG. 2 and FIG. 3 are formed on the organic thin film EL 50. Thereafter, the surface of the organic thin film EL 50 is covered with the cap 1 so that the connectors 2 and 3 can be passed through the openings 1 and 1b, respectively. Then, in the openings 1a and 1b, a contact portion of the connectors 2 and 3 with the cap 1 and a contact portion of the organic thin film EL 50 with the cap 1 are sealed by an adhesive agent which consists of a material such as epoxy having a high airtight property and a low water vapor permeability, and thereby, it is possible to shield the inner side of the cap 1 from an external air.

In this case, when the organic thin film EL is exposed in a water vapor or oxygen, it rapidly deteriorates. For this reason, the aforesaid work including the formation of the protection layer 4 to sealing should be carried out in an oxygen-free dry atmosphere such as a dry nitrogen atmosphere.

Figure 4:
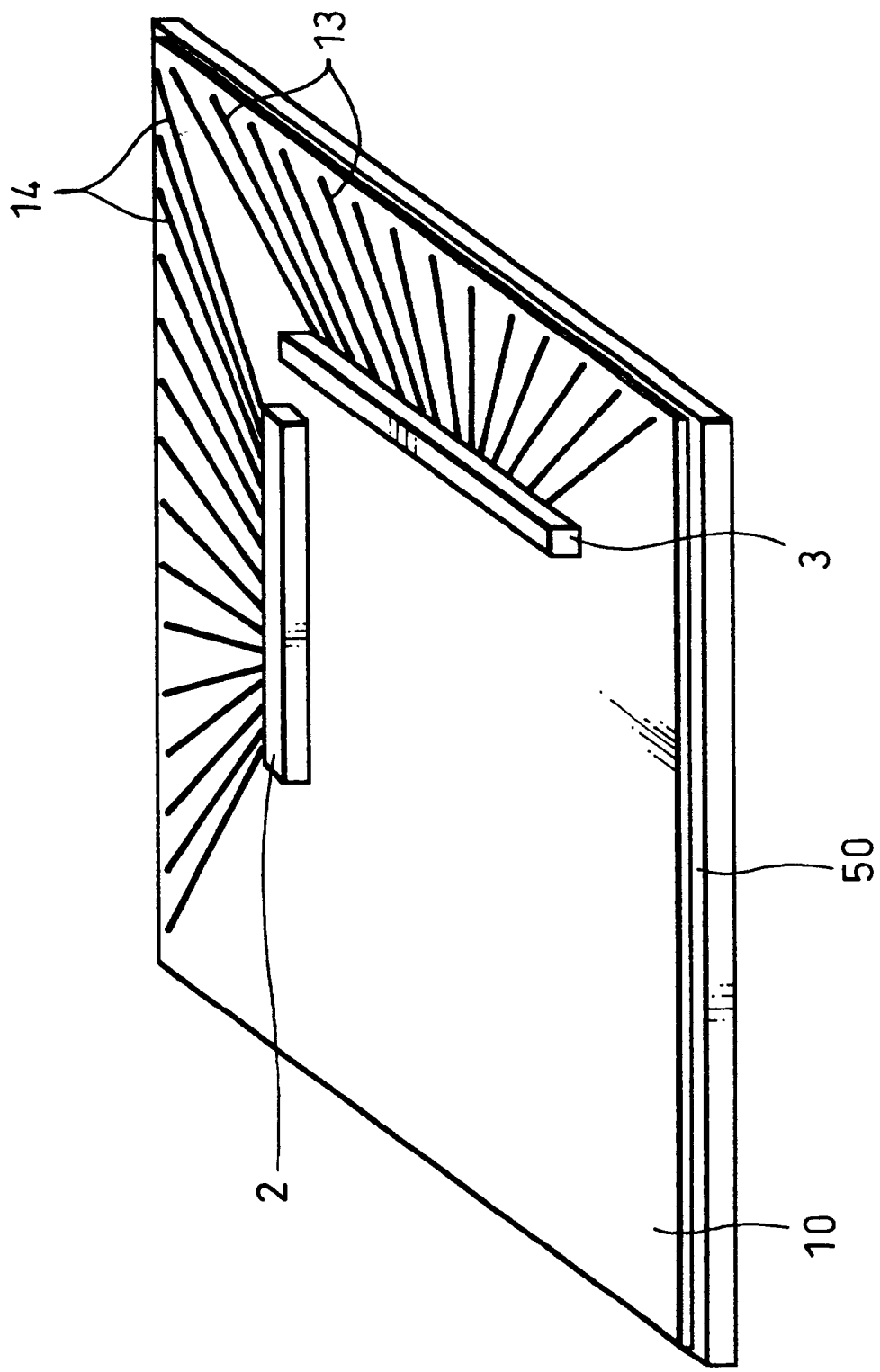
FIG. 4 is a perspective view showing another wiring inside of the cap in the organic thin film EL of FIG. 1.
Figure 5:
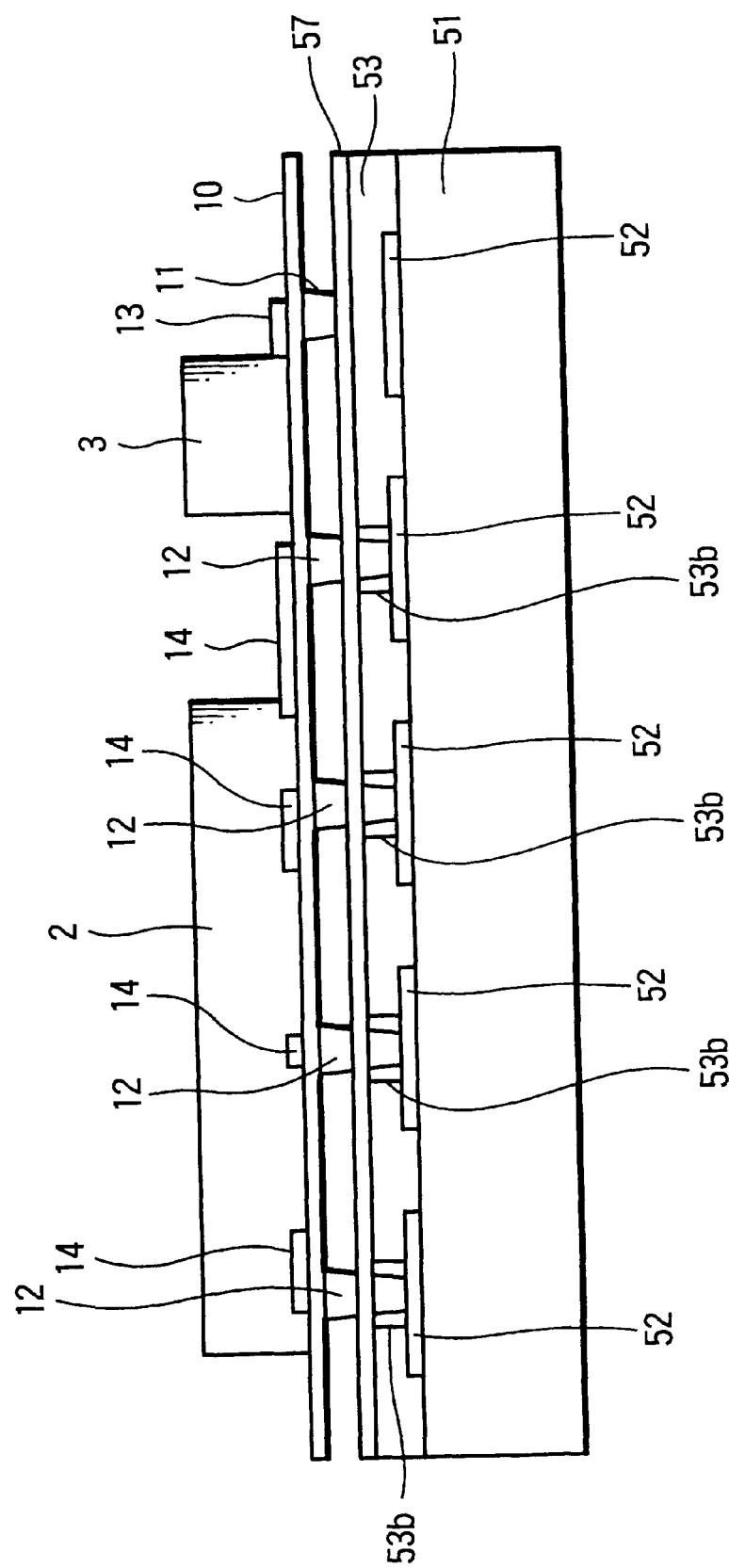
FIG. 5 is a cross sectional view showing a state of connecting a column electrode and a row electrode with a connector by the wiring of FIG. 4.

Next, FIG. 4 is a view showing another wiring inside of the cap 1 in the organic thin film EL 50 of FIG. 1, and FIG. 5 is a cross sectional view showing a state of connecting the column electrode 52 and the row electrode 57 with the connectors 2 and 3 by the wiring of FIG. 4. The back side of the organic thin film EL 50 is provided with a flexible printed cable (FPC) substrate 10 at the inside of the cap 1.

As shown in FIG. 5, each row electrode 57 contacts with a bump (projected connecting electrode) 11 which is formed on a surface opposite to a wiring surface of the FPC substrate 10 at a position avoiding the overhead position of the intersecting point with the column electrode 52. The organic layer 53 is formed with a through hole 53b which extends to the column electrode 52 at the overhead position of each column electrode 52 and at a position avoiding the overhead position of the row electrode 57. Each column electrode 52 is connected with a bump 12 which is formed on a lower surface of the FPC substrate 10 and is inserted into the through hole 53b. These bumps 11 and 12 has a height of about 5 to 50 μm, and the bump 12 is higher than the bump 11 by the film thickness of the organic layer 53.

The FPC substrate 10 comprises an insulating base material having flexibility, such as polyimide, PET (polyethylene terephthalate), liquid crystal polymer, thin glass epoxy or the like. As shown in FIG. 4 and FIG. 5, the FPC substrate 10 is mounted with the connectors 2 and 3, a wiring 13 for connecting the connector 3 and each bump 11 and a wiring 14 for connecting the connector 2 and each bump 12 are formed on the FPC substrate 10.

Accordingly, a scanning signal from the row driver IC 63 is supplied to each row electrode 57 using the contact portion with the bump 11 as a feeding point, whereas a display signal from the column driver IC 60 is supplied to each column electrode 52 using the contact portion with the bump 12 as a feeding point.

Figure 6:
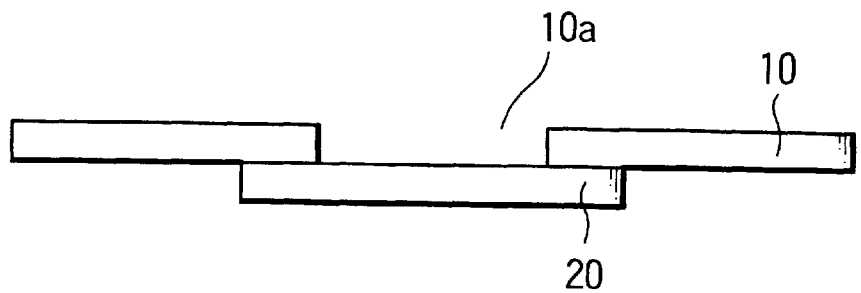
FIG. 6 is a view to explain a method of forming a bump to an FPC substrate.

Next, the following is a description on a method of forming the wirings as shown in FIG. 4 and FIG. 5 on the organic thin film EL 50. In order to form the bumps 11 and 12 on the FPC substrate 10, as shown in FIG. 6, the FPC substrate 10 is previously provided with a through hole 10a at a position of forming the bumps 11 and 12.

Subsequently, any of the following processes (1) to (3) is carried out on a copper foil 20 constituting the wirings 13 and 14 of the FPC substrate 10 via the through hole 10a, to form the bumps 11 and 12.

Figure 7A:
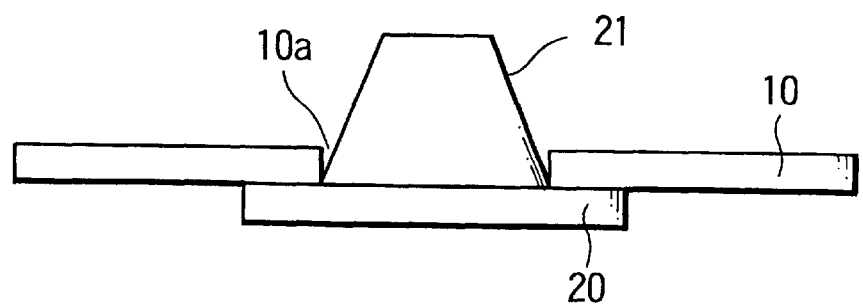
FIG. 7 is a view to explain a method of forming a bump to an FPC substrate.

(1) As shown in FIG. 7A, a conductive paste 21 such as a silver paste and a copper paste is printed on the fine lines 13 and 14, and then, the conductive paste 21 is thermally hardened at a low temperature.

Figure 7B:
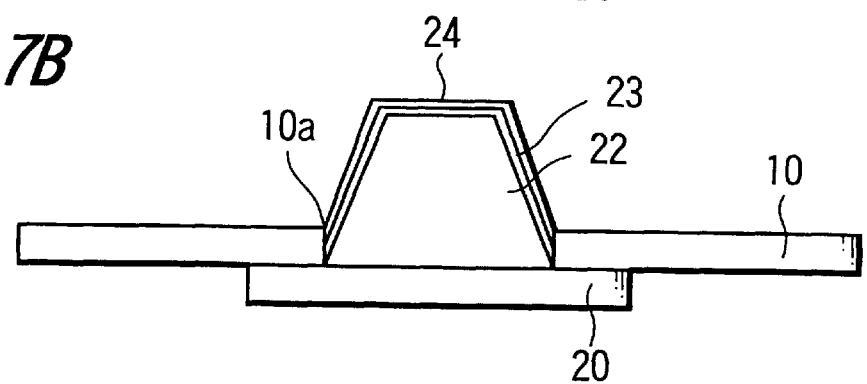

(2) As shown in FIG. 7B, the fine lines 13 and 14 are plated thick with copper 22 by an electrolytic plating method or an electroless plating method, and then, the surface of copper 22 is plated with nickel 23 by the electroless plating method. Thereafter, the surface of nickel 23 is plated with gold or palladium 24 by the electroless plating method.

Figure 7C:
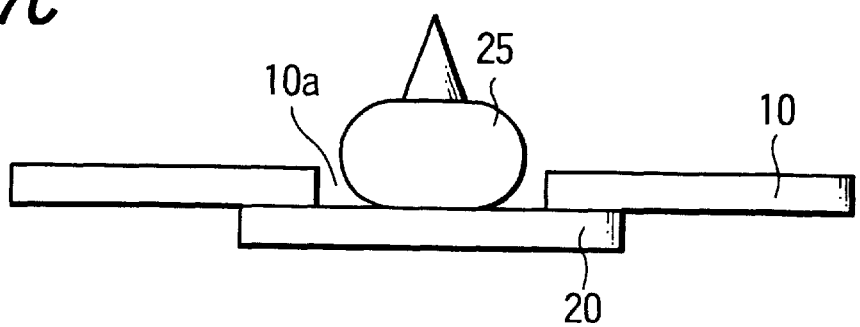

(3) As shown in FIG. 7C, gold 25 is bonded to the wirings 13 and 14 by ball bonding. (In this case, because the cut-off wire becomes like a stud; for this reason, a stud-like bump (stud bump) is formed as shown in FIG. 7C.)

Figure 8:
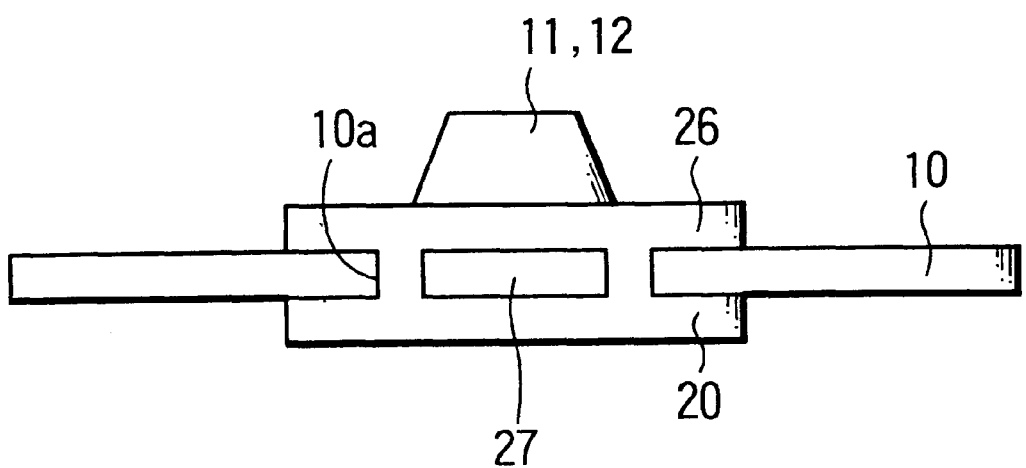
FIG. 8 is a view to explain a method of forming a bump to an FPC substrate.

Moreover, in addition to the FPC substrate 10 being provided with the through hole 10a at a portion corresponding to the copper foil 20 as shown in FIG. 6, the through hole 10a may be subjected to through hole plating, and then, as shown in FIG. 8, any of the above processes (1) to (3) may be carried out on a copper foil 26 stuck onto the side opposite to the wiring side by through hole plating, in order to form the bumps 11 and 12. In this case, in order to make flat of the copper foil 26, the through hole 10a is filled with a resin 27.

In order to connect the row electrode 57 and the column electrode 52 to the wirings 13 and 14 on the FPC substrate 10 where the bumps 11 and 12 are formed, first of all, as shown in FIG. 9A, polyester, vinyl chloride, vinyl acetate, polyamide, or a polyurethane-based thermoplastic resin, which becomes a thermoplastic state at a low temperature, is caused to be in the thermoplastic state at once, and are applied on the row electrode 57 by a printing method or by a film laminating method, and thus forming, a boding layer 28.

Subsequently, the bonding layer 28 is heated until the thermoplastic resin is softened and then, as shown in FIG. 9B, the FPC substrate 10 is made overlapped with the organic thin film EL 50 so that the bumps 11 and 12 may contact with the row electrode 57 and the column electrode 52, respectively. Then, the FPC substrate 10 and the organic thin film EL 50 are bonded to each other with pressure.

Thereafter, the bonding layer 28 is cooled until the thermoplastic resin is hardened. By doing so, the FPC substrate 10 is fixed onto the organic thin film EL 50, and thus a state of contacting the bumps 11 and 12 with the column electrode 52 and the row electrode 57 is maintained.

In place of forming the bonding layer 28 on the organic thin film EL 50 side as shown in FIG. 9A, the bonding layer 28 may be formed on the side opposite to the fine line side of the FPC substrate 10. Moreover, the works as shown in FIG. 6 to FIG. 9, that is, a work of forming the bumps 11 and 12 onto the FPC substrate and a work of bonding of the FPC substrate 10 to the organic thin film EL 50 with pressure may be carried out after the connectors 2 and 3 is mounted on the FPC substrate 10 and the wirings 13 and 14 are installed thereon. Alternatively, these works may be carried out before the connectors 2 and 3 is mounted on the FPC substrate 10 and the wirings 13 and 14 are installed thereon.

In the aforesaid organic thin film EL 50, the wirings for connecting the column electrode 52 and the row electrode 57 to driver circuits (column driver IC 60, row driver IC 63), are led from the inside of the cap 1 covering the back surface of the organic thin film EL 50 to the back side of the organic thin film EL 50. Therefore, the wirings are arranged on the inside of the cap 1 and the back side of the organic thin film EL.

In FIG. 1, the column driver substrate 61 and the row driver substrate 64 are arranged around the edge portion of the organic thin film EL like a picture frame. However, if the FPC substrates 62 and 65 are bent upwardly, and thereby, the column driver substrate 61 and the row driver substrate 64 can be provided without being arranged around the edge portion of the organic thin film EL 50.

Accordingly, it is possible to reduce an area of the display panel using the organic thin film EL 50 as a display device. Moreover, if the plurality of these display panels are arranged like a tile, there exists no wiring and driver circuit between adjacent display panels, and therefore, it is possible to reduce a non-display area when using the plurality of display panels as a single screen.

Figure 17:
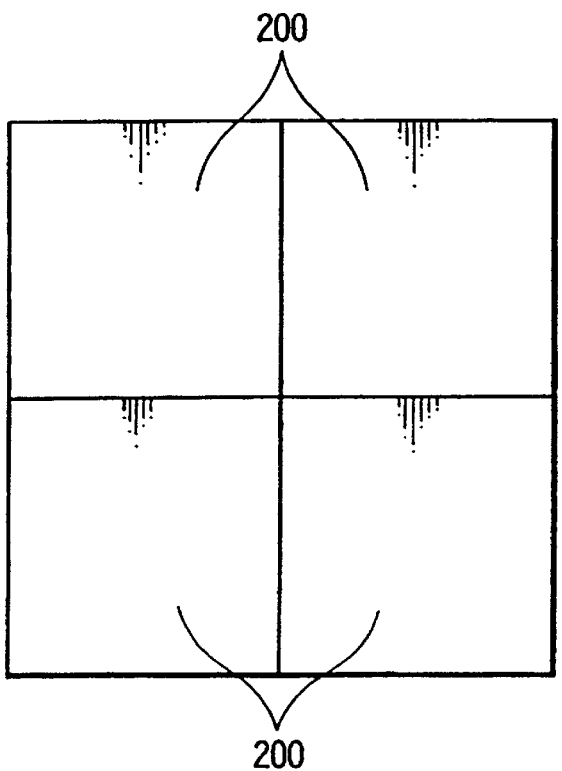
FIG. 17 is a view showing a state that a plurality of display panels using the organic thin film EL, to which the present invention is applied, are arranged.

FIG. 17 is a view showing a state that a plurality of display panels using the organic thin film EL according to the present invention, are arranged. A plurality of display panels 200 using the organic thin film EL 50 as a display device are arranged like a tile, which forms a large-scale image display system constituting a single screen as a whole. Since no wiring and driver circuit exists between adjacent display panels, a joints (boundaries between adjacent display panels) can be made inconspicuous when displaying an image.

In the organic thin film EL 50, a part of the wirings for connecting the column electrode 52 and the row electrode 57 to the driver circuits (in FIG. 2, wirings 5 and 7; in FIG. 5, bumps 11, 12 and wirings 13, 14) is arranged inside the cap 1, thereby being are shielded from an external air. Accordingly, even when the display is used at a place having a high humidity, it is possible to prevent a migration by an external air in the part of wirings.

Moreover, a drying agent and an oxidation inhibitor are arranged inside the cap 1, and so a water content and oxygen, which slightly permeate into the inside of the cap 1 and are contained in the cap 1 itself are absorbed into these drying agent and oxidation inhibitor. Therefore, it is possible to prevent the organic thin film EL 50 from being deteriorated due to such water content and oxygen, and also to prevent a generation of migration by the above water content.

[Embodiment 2]

Figure 10:
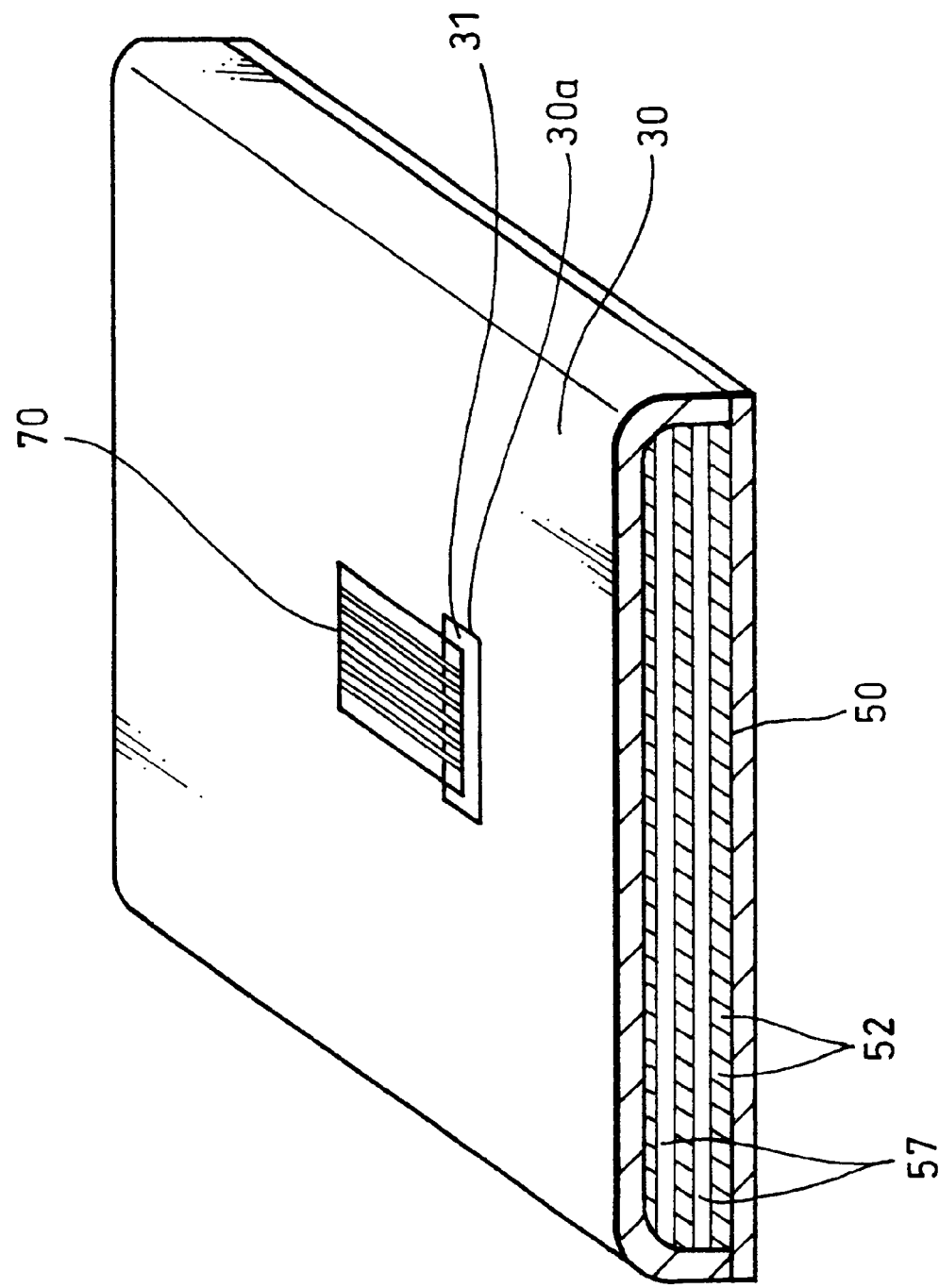
FIG. 10 is a perspective view showing another appearance structure of the organic thin film EL to which the present invention is applied.

Next, a second embodiment of the organic thin film EL according to the present invention will be described. FIG. 10 is a view showing another example of appearance of the organic thin film EL. A back surface(surface on the upper side in FIG. 10) of the organic thin film EL 50 is covered with a sealing cap 30 (the front portion of FIG. 10 is shown as a cross section). The sealing cap 30 comprises a material having an excellent sealing property such as an aluminum or iron plate, or a glass plate.

Figure 14:
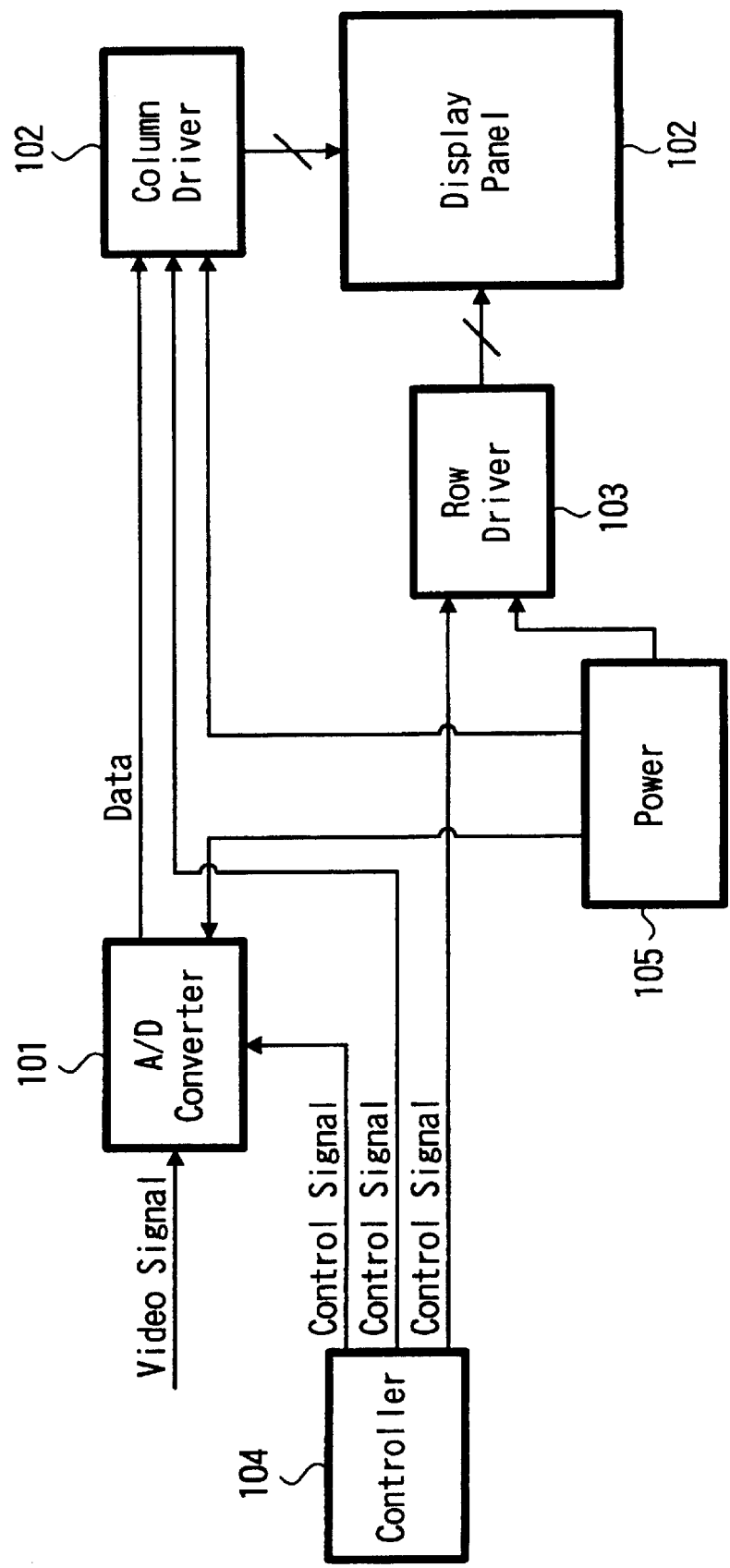
FIG. 14 is a block diagram showing a circuit construction of a display unit using the organic thin film EL.
Figure 15:
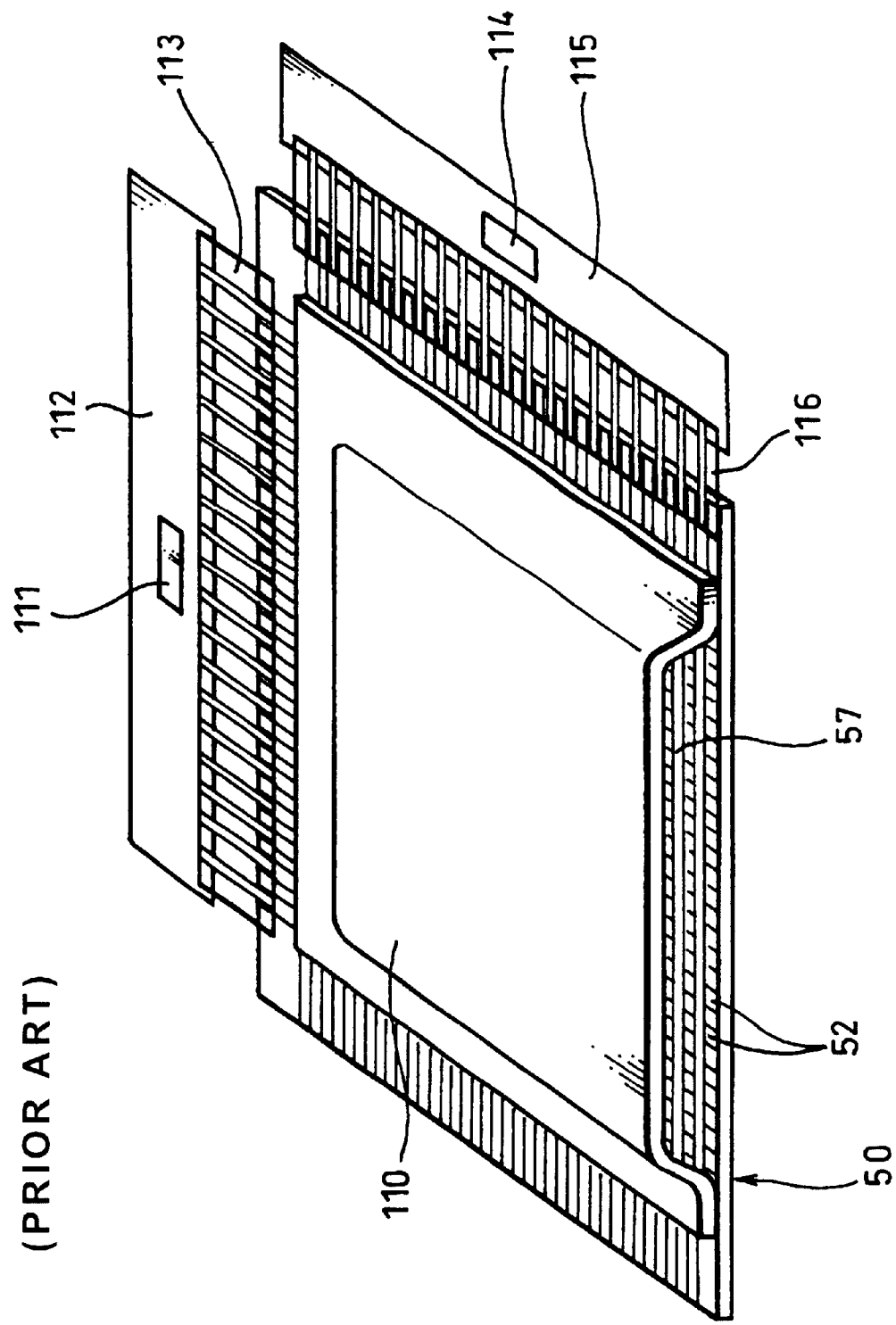
FIG. 15 is a perspective view showing conventional wiring of a organic thin film EL.
Figure 16:
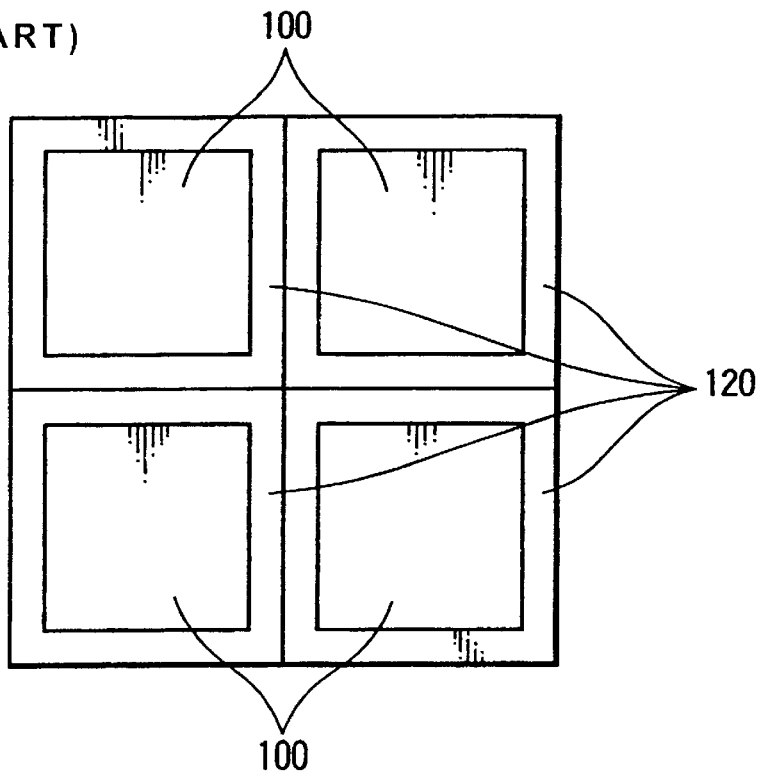
FIG. 16 is a view showing a state that a plurality of display panels using the organic thin film EL having the conventional wiring are arranged.

On the back surface of the organic thin film EL 50, a connectors 31 is exposed through an opening 30a which is formed in the cap 30 and has the substantially same size as the connector 31. The connector 31 is used for connecting a power supply circuits and a signal supply circuit (A/D converter 101, controller 104 and power supply block 105 in FIG. 14) to driver circuits of the column electrode 52 and the row electrode 57. Further, the connector 31 is connected to these power supply circuit and signal supply circuit via an FPC substrate 70 therefore. In the inside of the cap 30, a drying agent and an oxidation inhibitor (both not shown) are arranged by, e.g. being applied to the inner surface of the cap 30.

Figure 11:
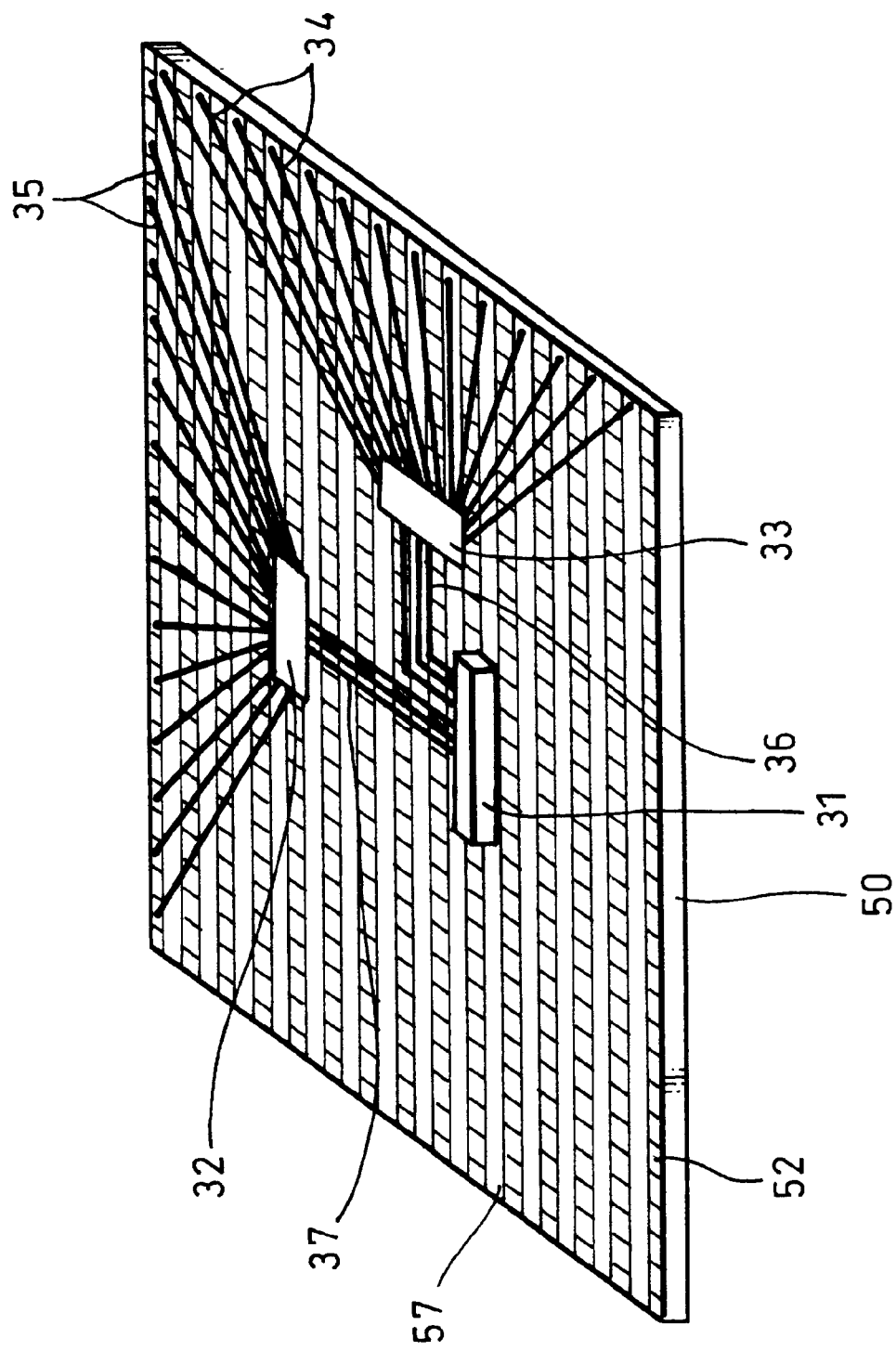
FIG. 11 is a perspective view showing a wiring inside of a cap in the organic thin film EL of FIG. 10.

FIG. 11 is a view showing the wirings inside the cap 30 on the organic thin film EL 50 of FIG. 10. A protection layer (not shown) made of an insulating material is formed on the back surface of the organic thin film EL 50 (i.e., on the row electrode 57). The protection layer is mounted with the connector 31, a column driver IC 32 and a row driver IC 33.

The protection layer and an organic layer of the organic thin film EL 50 are provided with the same through holes as those shown in FIG. 3 in the above embodiment 1. The row driver IC 33 and each row electrode 57 at the bottom portion of the through hole are connected with each other by a wiring 34 which is formed on the protection layer and in the through hole. The column driver IC 32 and of the each column electrode 52 at the bottom portion of the through hole are connected by a wiring 35 which is formed on the protection layer side and inside the through hole.

Moreover, on the surface of the protection layer is formed a wiring 36 for connecting the row driver IC 33 to the connector 31, and a wiring 37 for connecting the column driver IC 32 to the connector 31.

Accordingly, a scanning signal from the row driver IC 33 is supplied to each row electrode 57 using the bottom portion of the through hole as a feeding point, whereas a display signal from the column driver IC 32 is supplied to each column electrode 52 using the bottom portion of the through hole as a feeding point.

A method for installing the wiring as shown in FIG. 11 on the organic thin film EL 50 may be the same as the method for installing the wiring as shown in FIG. 2 and FIG. 3 on the organic thin film EL 50 in the above embodiment 1, except that electronic components mounted and wirings installed on the protection layer are different.

Figure 12:
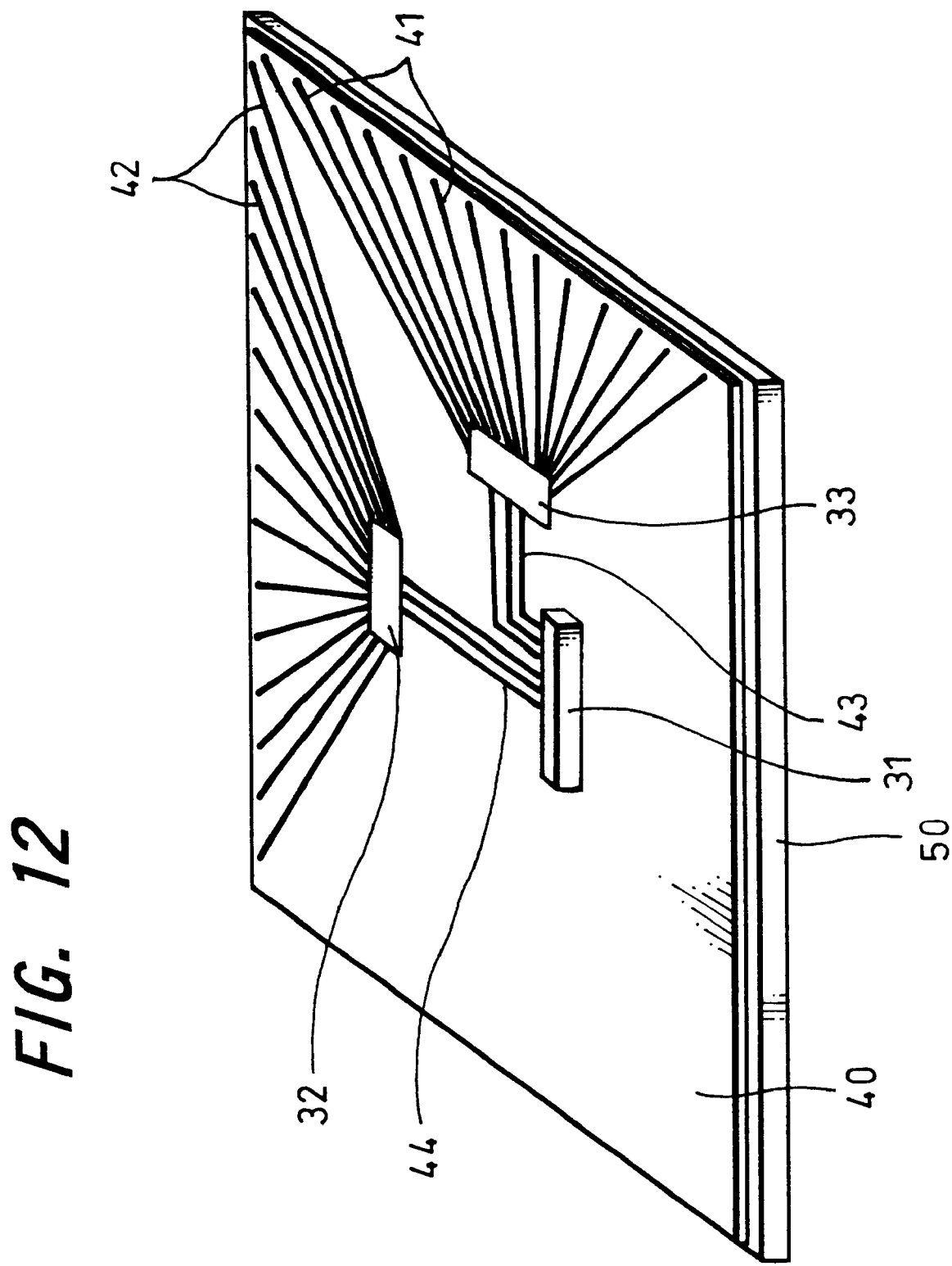
FIG. 12 is a perspective view showing another wiring inside wiring of the cap in the organic thin film EL of FIG. 10.

Next, FIG. 12 is a view showing another example of the wiring of the cap 30 on the organic thin film EL 50 of FIG. 10. The back surface of the organic thin film EL 50 is provided with a flexible printed cable (FPC) substrate 40 inside the cap 1. The FPC substrate 40 is mounted with the connector 31, the column driver IC 32 and the row driver IC 33.

On the FPC substrate 40 are formed the same bumps as those of the FPC substrate 10 shown in FIG. 5 in the above embodiment 1. These bumps contact with the column electrode 57 and the row electrode 52 in the same manner as shown in FIG. 5. Furthermore, on the FPC substrate 40 are formed a wiring 41 for connecting the row driver IC 33 to each bump for row electrode 57, and a wiring 42 for connecting the column driver IC 32 to each bump for column electrode 52.

Moreover, on the FPC substrate 40 are formed with a wiring 43 for connecting the row driver IC 33 to the connector 31, and a wiring 44 for connecting the column driver IC 32 to the connector 31.

Accordingly, a scanning signal from the row driver IC 33 is supplied to each row electrode 57 using a contact portion with these bumps as a feeding point, whereas a display signal from the column driver IC 32 is supplied to each column electrode 52 using a contact portion with these bumps as a feeding point.

A method for installing the wiring as shown in FIG. 12 on the organic thin film EL 50 may be the same as the method for installing the wiring as shown in FIG. 4 and FIG. 5 on the organic thin film EL 50 in the above embodiment 1, except that electronic components mounted and wirings installed on the FPC substrate 40 are different.

On the organic thin film EL 50 of this second embodiment, in addition to the wiring for connecting the column electrode 52 and the row electrode 57 with the driver circuit, the driver circuits (column driver IC 32, row driver IC 33) is arranged inside the cap 30 covering the back surface of the organic thin film EL 50. Therefore, there is no need of upwardly bending the wiring (FPC substrate 62, 65) outside the organic thin film EL 50 as described in the above embodiment 1 with reference to FIG. 1, and the driver circuits are not arranged like a picture frame around the organic thin film EL 50. Thus, it is possible to more readily reduce a non-display area when arranging a plurality of display panels using the organic thin film EL 50 as a display device like a tile to form a single screen as shown in FIG. 17.

The wirings for connecting the driver circuit with the power supply circuit and the signal supply circuits (wirings 36 and 37, connector 31 and FPC substrate 70 in FIG. 11; and wirings 43 and 44, connector 31 and FPC substrate 70 in FIG. 12), are arranged inside the cap 30 and on the back surface of the organic thin film EL 50. Therefore, these wirings are not arranged like a picture frame around the edge portion of the organic thin film EL 50.

Moreover, on the organic thin film EL 50, the wirings for connecting the column electrode 52 and the row electrode 57 with the driver circuits (wirings 34 and 35 in FIG. 11; and wirings 41, 42 and bumps in FIG. 12), are all arranged inside the cap 30, thus making it possible to prevent the generation of migration by an external air. Also, the driver circuits are arranged inside the cap 30, thus making it possible to prevent the driver circuits from being deteriorated by an external air.

The structure of the organic thin film EL according to the present invention is applied, is not limited to such as shown in FIG. 13, and may have other structure (e.g., the light emission layer and the electron transport layer are not separated, but formed into a single layer).

The present invention is applied not only to the organic thin film EL as described above, but also to an organic dispersion EL, an inorganic thin film EL or an inorganic dispersion EL. Further, the present invention may be applied to flat display device (in particular, the entire flat display device consists of a solid) other than these ELs.

While the invention has been described with reference to specific embodiment chosen for purpose of illustration, it should be apparent that numerous modification could be made thereto by those skilled in the art without departing from the basic concept and scope of the invention.

What is claimed is:

1. A flat display device comprising:
   a display material,
   a plurality of electrodes laminated onto the display material;
   a plurality of wiring members connecting the electrodes to a connector;
   a flexible cable connecting the connector to a driver circuit;
   a flexible printed board on which the wiring members are installed; and
   a sealing member covering a back surface of the flat display device, the plurality of electrodes, the connector and the flexible printed board, and wherein the wiring members are installed inside the sealing member on an insulating protection layer formed on the back surface of the flat display device.

2. The flat display device according to claim 1, wherein a connector for connecting a driver circuit to the electrode is exposed to the back side of the flat display device via an opening formed in the sealing member.

3. The flat display device according to claim 1, wherein at least either of a drying agent or an oxidation inhibitor is arranged inside the sealing member.

4. The flat display device according to claim 1, wherein the display material is a light emissive material based on electro-luminescence using an organic compound.

5. A flat display device comprising:
   a display material,
   a plurality of electrodes laminated onto the display material;
   a sealing member covering a back surface of the flat display device and the plurality of electrodes;
   a driver circuit connected to the electrodes inside the sealing member; and
   a power supply circuit and a signal supply circuit connected to the driver circuit by a plurality of wiring members.

6. The flat display device according to claim 5, wherein the driver circuit is mounted on an insulating protection layer inside the sealing member, and wherein the insulating protection layer is formed on the back surface of the flat display device.

7. The flat display device according to claim 5, wherein the inside of the sealing member is mounted with the driver circuit, and is provided with a flexible printed board on which the wiring is installed.

8. The flat display device according to claim 5, wherein a connector for connecting a power supply circuit and a signal supply circuit to the driver circuit is exposed to the back side of the flat display device via an opening formed in the sealing member.

9. The flat display device according to claim 5, wherein at least either of a drying agent or and an oxidation inhibitor is arranged inside the sealing member.

10. The flat display device according to claim 5, wherein the display material is a light emissive material based on electro-luminescence using an organic compound.

11. A wiring method for connecting an electrode to a driver circuit in a flat display device laminating a display material and an electrode, comprising the steps of:
   forming a thermoplastic bonding layer on a back surface of the flat display device;
   mounting a connector for connecting a driver circuit to the electrode on a flexible printed board, and installing a wiring for connecting the connector to the electrode on the flexible printed board;
   forming a bump on a portion corresponding to the wiring in the flexible printed board;
   heating the bonding layer, and bonding the flexible printed board onto the back surface of the flat display device with pressure while contacting the bump with the electrode;
   covering the back surface of the flat display device with a sealing member having an opening at its part thereof so that the connector may be passed through the opening; and
   sealing a contact portion of the connector with the sealing member.

12. A wiring method for connecting an electrode to a driver circuit in a flat display device laminating a display material and an electrode, comprising the steps of:
   forming an insulating protection layer on a back surface of the flat display device;
   mounting a driver circuit and a connector for connecting a signal line and power supply line to the driver circuit on the protection layer, and installing a wiring for connecting the driver circuit to the electrode and a wiring for connecting the connector to the driver circuit on the protection layer;
   covering the back surface of the flat display device with a sealing member having an opening at its part thereof so that the connector may be passed through the opening; and
   sealing a contact portion of the connector with the sealing member.

13. A wiring method for connecting an electrode to a driver circuit in a flat display device laminating a display material and an electrode, comprising the steps of:
   forming a thermoplastic bonding layer on a back surface of the flat display device;
   mounting a driver circuit and a connector for connecting a signal line and power supply line to the driver circuit on a flexible printed board, and forming a wiring for connecting the driver circuit to the electrode and a wiring for connecting the connector to the driver circuit on the flexible printed board;
   forming a bump on a portion corresponding to the wiring for connecting the driver circuit to the electrode in the flexible printed board;
   heating the bonding layer, and bonding the flexible printed board onto the back surface of the flat display device with pressure while contacting the bump with the electrode;
   covering the back surface of the flat display device with a sealing member having an opening at its part thereof so that the connector may be passed through the opening; and
   sealing a contact portion of the connector with the sealing member.

14. An image display system comprising a plurality of display panels which are arranged side by side so as to constitute a single screen, wherein each display panel comprises a display material, a plurality of electrodes laminated onto the display material; a plurality of wiring members connecting the electrodes to a connector; a flexible cable connecting the connector to a driver circuit; and a sealing member covering a back surface of the flat display device, the plurality of electrodes, the connector and a flexible printed board.

15. An image display system having a plurality of display panels which are arranged side by side so as to form a single screen, wherein each display panel comprises a display material, a plurality of electrodes laminated onto the display material; a sealing member covering a back surface of the flat display device and the plurality of electrodes; a driver circuit connected to the electrodes inside the sealing member; and a power supply circuit and a signal supply circuit located outside of the sealing member and connected to the driver circuit by a plurality of wiring members; wherein the wiring members extend from the inside of the sealing member and emerge from the back side of the flat display device.

16. An image display system comprising a plurality of display panels which are arranged side by side so as to form a single screen, wherein each display panel comprises a display material, a plurality of electrodes laminated onto the display material; a plurality of wiring members connecting the electrodes to a connector; a flexible cable connecting the connector to a driver circuit; a flexible printed board on which the wiring members are installed; and a sealing member covering a back surface of the flat display device, the plurality of electrodes, the connector and the flexible printed board.

17. An image display system having a plurality of display panels which are arranged side by side so as to form a single screen, wherein each display panel comprises a display material, a plurality of electrodes laminated onto the display material; a plurality of wiring members connecting the electrodes to a connector; a flexible cable connecting the connector to a driver circuit; a flexible printed board on which the wiring members are installed; a power supply circuit and a signal supply circuit connected to the driver circuit; and a sealing member covering a back surface of the flat display device, the plurality of electrodes, the connector and the flexible printed board.

* * * * *